(12) United States Patent
Yukinobu

(10) Patent No.: US 8,043,409 B2
(45) Date of Patent: Oct. 25, 2011

(54) INDIUM-BASED NANOWIRE PRODUCT, OXIDE NANOWIRE PRODUCT, AND ELECTROCONDUCTIVE OXIDE NANOWIRE PRODUCT, AS WELL AS PRODUCTION METHODS THEREOF

(75) Inventor: Masaya Yukinobu, Ichikawa (JP)

(73) Assignee: Sumitomo Metal Mining Co., Ltd., Tokyo (JP)

(*) Notice: Subject to any disclaimer, the term of this patent is extended or adjusted under 35 U.S.C. 154(b) by 781 days.

(21) Appl. No.: 12/084,783

(22) PCT Filed: Nov. 10, 2006

(86) PCT No.: PCT/JP2006/322917
§ 371 (c)(1),
(2), (4) Date: May 9, 2008

(87) PCT Pub. No.: WO2007/055422
PCT Pub. Date: May 18, 2007

(65) Prior Publication Data
US 2009/0110928 A1 Apr. 30, 2009

(30) Foreign Application Priority Data
Nov. 10, 2005 (JP) ................. 2005-326749

(51) Int. Cl.
*C22B 58/00* (2006.01)
*B82B 1/00* (2006.01)
*B22F 1/00* (2006.01)
(52) U.S. Cl. .......... 75/688; 420/489; 420/555; 148/284; 438/608; 977/817; 977/762

(58) Field of Classification Search .............. 148/284; 75/688; 420/489, 555; 438/608; 977/817, 977/762
See application file for complete search history.

(56) References Cited

FOREIGN PATENT DOCUMENTS
JP 63270404 11/1988

OTHER PUBLICATIONS

English Abstract of JP 63270404.
Y. Bando, "Nanothermometer Using Oxide Nanotubes" in Materials Intergration, vol. 18, No. 1, Dec. 24, 2004, pp. 42-47. Including English Abstract.
C. Tony et al., "Preparation and Structure of Magnesium Oxide Coated Indium Nanowires" in Chemical Physics Letters, vol. 382, No. 314, Dec. 5, 2003, pp. 374-380.
English Abstract of JP 63270404.

*Primary Examiner* — Roy King
*Assistant Examiner* — Lois Zheng
(74) *Attorney, Agent, or Firm* — Dykema Gossett PLLC

(57) ABSTRACT

A production method of an indium-based nanowire product comprising indium-based nanowires according to the present invention is characterized in that the method comprises the step of: disproportionation-reacting particles including indium subhalide as main components in a nonaqueous solvent, to obtain nanowires including metal indium as main components. The electroconductive oxide nanowire product comprising electroconductive oxide nanowires of the present invention can be obtained by: subjecting, the indium nanowires additionally doped with doping metals, to a heating oxidation treatment; or doping oxides of doping metals into indium oxide nanowires obtained from the indium-based nanowires.

10 Claims, 5 Drawing Sheets

INDIUM-BASED NANOWIRE PRODUCT, OXIDE NANOWIRE PRODUCT, AND ELECTROCONDUCTIVE OXIDE NANOWIRE PRODUCT, AS WELL AS PRODUCTION METHODS THEREOF

TECHNICAL FIELD

The present invention relates to an indium-based nanowire product, an oxide nanowire product, and an electroconductive oxide nanowire product, as well as production methods thereof, and more particularly to: an indium-based nanowire product and an electroconductive oxide nanowire product (hereinafter called "indium-based nanofiber product" and "electroconductive oxide nanofiber product", respectively, as the case may be) each including nanowires having an averaged thickness in a nano-size and having wire shapes with a ratio of averaged length to averaged thickness (i.e., aspect ratio) of 30 or more in a manner to be exemplarily utilized as electroconductive fillers of various transparent electroconductive films, and as nano-wirings; as well as production methods for expediently and inexpensively producing the indium-based nanowire product and the electroconductive oxide nanowire product, respectively.

BACKGROUND ART

Typically, transparent electroconductive films to be utilized as transparent electrodes and the like are each formed by application of a transparent electroconductive paint comprising a solvent including a binder and electroconductive fillers dispersed therein. Further, as electroconductive fillers of transparent electroconductive paints, there have been adopted oxide-based fillers such as indium tin oxide (hereinafter called "ITO", as the case may be), antimony tin oxide (hereinafter called "ATO", as the case may be), and the like, and there has been recently proposed a method for using nanorods, nanowires and the like made of gold, silver, or the like as described in a patent document 1, for example.

Incidentally, although metal indium acts as an electroconductor as it is, oxidation thereof produces indium oxide, and additionally doping tin thereinto produces an indium tin oxide (ITO) known as a transparent electroconductive material, so that obtainment of indium nanowires having larger aspect ratios will allow for expectation thereof as fillers of various transparent electroconductive paints.

However, metals for the above-described conventional metal nanowires have been limited to noble metals and the like which are susceptible to be reduced in an aqueous solution, and nanowires have not been obtained up to now based on indium which has a relatively strong bonding force to oxygen.

Further, excellent electroconductive properties such as exhibited by nanowires having larger aspect ratios are not obtained by: the above-mentioned metal nanowires such as the above-described gold nanorods and the like having smaller aspect ratios (ratios of lengths to thicknesses) which can be hardly regarded as wires; metal fine particles which are merely concatenated in chain shapes; and the like; so that there have been desired single crystalline nanowires having larger aspect ratios and being desirably free of grain boundaries, with respect to indium as well.

Meanwhile, in a patent document 2, there has been proposed a production method of a thin single crystalline metallic wire, comprising the steps of: twisting a metallic wire into a helical shape at a predetermined twisting speed during heat treatment in a manner to attain a helix turn having an inclination angle of 20° to 58° relative to a longitudinal direction of the helix, thereby applying a uniform plastic deformation to the wire up to an extent exceeding 98%; and cleaning the obtained wire to eliminate polycrystalline metal residues therefrom. This method utilizes a step of twisting one wire in a yielded condition thereof around a longitudinal axis thereof to perform shear plastic deformation at a deformation ratio higher than 98%, thereby forming a filamentary single crystal. It is described in the patent document that, for production of single crystal filaments of nickel, iron, copper, aluminum, indium, or the like, the twisting step is to be performed together with cooling, and cooling at −170° C. to −200° C. is required for indium wires.

However, in the embodiments of the patent document 2, there are simply described production examples having diameters of 1.3 to 4 μm for single crystal wires of tungsten, copper, steel, molybdenum, and iron, including descriptions of "thin single crystalline metallic wires having diameters of 0.01 to 5 μm" in the paragraph of "TECHNICAL FIELD" and "thin filaments having diameters of 0.1 to 5 μm" in the paragraph of "Problem to be solved by the Invention" of the specification of the patent document 2, so that the patent document 2 fails to show any reason that wires having diameters of 1 μm or less, particularly 0.1 μm or less can be produced.

Further, no descriptions are found concerning diameters of indium wires, even in the embodiments. Thus, the patent document 2 fully fails to disclose production of indium wires having diameters of about 0.1 μm, for example.

Moreover, the single crystalline metallic wires obtained by the above-described method are continuous threads of wires, respectively, which are different from wire-shaped fine particles and thus are not obtained in a state having an excellent dispersibility, thereby becoming short of mass-productivity and undesirable as fillers of transparent electroconductive paints.

Patent document 1: JP 2004-238503A2
Patent document 2: JP 2005-506270T2

DISCLOSURE OF THE INVENTION

Problem to be Solved by the Invention

The present invention has been carried out to remedy the above-described conventional problems, and it is therefore an object of the present invention to provide: a production method for expediently and inexpensively producing an indium-based nanowire product (indium-based nanofiber product) comprising indium-based nanowires in wire shapes having an averaged thickness of 500 nm or less and having a ratio of averaged length to averaged thickness (aspect ratio) of 30 or more, which indium-based nanowire product is exemplarily utilizable as electroconductive fillers of various transparent electroconductive films, and as nano-wirings; and an indium-based nanowire product obtained by the production method.

It is a further object of the present invention to provide: an oxide nanowire product comprising oxide nanowires including indium oxide as main components which oxide nanowires are obtained by using the nanowires including metal indium as main components; a production method for expediently and inexpensively producing the oxide nanowire product; an electroconductive oxide nanowire product obtained by using the indium-based nanowire product or oxide nanowire product; and a production method for expediently and inexpensively producing the electroconductive oxide nanowire product.

Means for Solving the Problem

The present inventors have earnestly conducted an investigation so as to achieve the objects and resultingly found out that, by obtaining wires including metal indium as main components by disproportionation-reacting particles including indium sub-halide as main components in a nonaqueous solvent, the thus obtained indium-based nanowire product includes nanowires having wire shapes with an averaged thickness of 500 nm or less and with a ratio of averaged length to averaged thickness (aspect ratio) of 30 or more, so that the indium-based nanowire product can be exemplarily utilized as electroconductive fillers of various transparent electroconductive films, and as nano-wirings, and adoption of the production method of the present invention enables production of an indium-based nanowire product in an expedient and inexpensive manner, thereby narrowly carried out the present invention. Further, according to the present invention, there has been also found out a method for expediently and inexpensively producing an electroconductive oxide nanowire product such as an ITO nanowire product or the like having an excellent electroconductivity, by utilizing the indium-based nanowire product or oxide nanowire product.

Namely, an indium-based nanowire product comprising indium-based nanowires including metal indium as main components according to the present invention, is characterized in that the nanowires have an averaged thickness of 500 nm or less.

Further, another indium-based nanowire product comprising indium-based nanowires including metal indium as main components according to the present invention, is characterized in that the nanowires have a ratio of averaged length of the nanowires to averaged thickness of the nanowires (aspect ratio) of 30 or more.

Furthermore, still another indium-based nanowire product comprising indium-based nanowires including metal indium as main components according to the present invention, is characterized in that the nanowires have an averaged thickness of 500 nm or less, and that the nanowires have a ratio of averaged length of the nanowires to averaged thickness of the nanowires (aspect ratio) of 30 or more.

Moreover, yet another indium-based nanowire product according to the present invention, is characterized in that the nanowires each have a single crystal structure.

Furthermore, a still further indium-based nanowire product according to the present invention, is characterized in that the indium-based nanowires further contain one or more kinds of dopant metals of tin, zinc, zirconium, titanium, germanium, tungsten, and aluminum, and that the content of the dopant metals is 0.2 mole or less relative to 1 mole of metal indium.

Further, an oxide nanowire product comprising oxide nanowires according to the present invention, is characterized in that the oxide nanowire product is obtained by subjecting, the above-described indium-based nanowires including metal indium as main components, to a heating oxidation treatment in an atmosphere containing oxygen and/or ozone.

Furthermore, an electroconductive oxide nanowire product comprising electroconductive oxide nanowires according to the present invention, is characterized in that the electroconductive oxide nanowire product is obtained by subjecting, the above-described indium-based nanowires including metal indium as main components and containing dopant metals, to a heating oxidation treatment in an atmosphere containing oxygen and/or ozone.

Moreover, another electroconductive oxide nanowire product comprising electroconductive oxide nanowires according to the present invention, is characterized in that the electroconductive oxide nanowire product is obtained by doping, oxides of one or more kinds of dopant metals of tin, zinc, zirconium, titanium, germanium, tungsten, and aluminum, into the above-described oxide nanowires including indium oxide as main components.

Further, still another electroconductive oxide nanowire product according to the present invention, is characterized in that the electroconductive oxide nanowires include indium tin oxide as main components.

Furthermore, a production method of an indium-based nanowire product comprising indium-based nanowires according to the present invention, is characterized in that the method comprises the step of:

disproportionation-reacting particles including indium subhalide as main components in a nonaqueous solvent, to obtain nanowires including metal indium as main components.

Moreover, another production method of an indium-based nanowire product according to the present invention, is characterized in that the method further comprises the step of:

subjecting the particles including indium subhalide as main components to a pulverization treatment, prior to the disproportionation reaction in the nonaqueous solvent;

that the subhalide is subchloride; and that the nonaqueous solvent contains a polymer dispersant therein.

Another production method of an indium-based nanowire product according to the present invention, is characterized in that the particles including indium subhalide contain compounds of one or more kinds of dopant metals of tin, zinc, zirconium, titanium, germanium, tungsten, and aluminum, thereby obtaining nanowires including metal indium as main components and containing dopant metals.

Further, still another production method of an indium-based nanowire product of the present invention, is characterized in that the method further comprises the step of:

coating, one or more kinds of dopant metals of tin, zinc, zirconium, titanium, germanium, tungsten, and aluminum and/or compounds of the dopant metals, onto the above-described indium-based nanowires including metal indium as main components.

Next, a production method of an oxide nanowire product comprising oxide nanowires according to the present invention, is characterized in that the method comprises the step of:

subjecting, the indium-based nanowires obtained by the above-described method, to a heating oxidation treatment in an atmosphere including oxygen and/or ozone, thereby obtaining oxide nanowires including indium oxide as main components.

Further, a production method of an electroconductive oxide nanowire product comprising electroconductive oxide nanowires according to the present invention, is characterized in that the method comprises the step of:

subjecting, the indium-based nanowires obtained by the above-described method, to a heating oxidation treatment in an atmosphere containing oxygen and/or ozone, thereby obtaining nanowires including indium oxide as main components and containing oxides of dopant metals.

Furthermore, another production method of an electroconductive oxide nanowire product comprising electroconductive oxide nanowires according to the present invention, is characterized in that the method comprises the steps of:

doping, one or more kinds of dopant metals of tin, zinc, zirconium, titanium, germanium, tungsten, and aluminum and/or compounds of the dopant metals, into the nanowires including indium oxide as main components obtained by the above-described method; and then subjecting the oxide nanowires to a heat treatment, thereby obtaining nanowires including indium oxide and containing oxides of the dopant metals.

Moreover, still another production method of an electroconductive oxide nanowire product comprising electroconductive oxide nanowires according to the present invention, is characterized in that the electroconductive oxide nanowires include indium tin oxide as main components.

Effect of the Invention

The production method of indium-based nanowire product comprising indium-based nanowires according to the present invention is characterized in that the method comprises the step of: disproportionation-reacting particles including indium subhalide as main components in a nonaqueous solvent, to obtain nanowires including metal indium as main components; and thus, the indium-based nanowire product obtained by this production method is a novel material which has never been obtained at all, and the nanowires have an averaged thickness of 500 nm or less and/or the nanowires have a ratio of averaged length of the nanowires to averaged thickness of the nanowires (aspect ratio) of 30 or more, so that the indium-based nanowire product can be exemplarily utilized as electroconductive fillers of various transparent electroconductive films and as nano-wirings. Further, adopting the production method of the present invention enables expedient and inexpensive production of an indium-based nanowire product comprising indium-based nanowires. Furthermore, it is possible to expediently and inexpensively produce a nanowire product comprising nanowires including indium oxide as main components, by subjecting, the nanowires including metal indium as main components obtained by the above-described method, to a heating oxidation treatment in an atmosphere containing oxygen and/or ozone. Although metal indium acts as an electroconductor as it is, oxidation thereof produces indium oxide, and additionally doping various dopant metals thereinto produces electroconductive oxides, thereby enabling obtainment of nanowires such as indium tin oxide (ITO) and the like useful as transparent electroconductive materials, which nanowires can be utilized as electroconductive fillers of various transparent electroconductive paints.

BEST MODE FOR CARRYING OUT THE INVENTION

Figure 1:
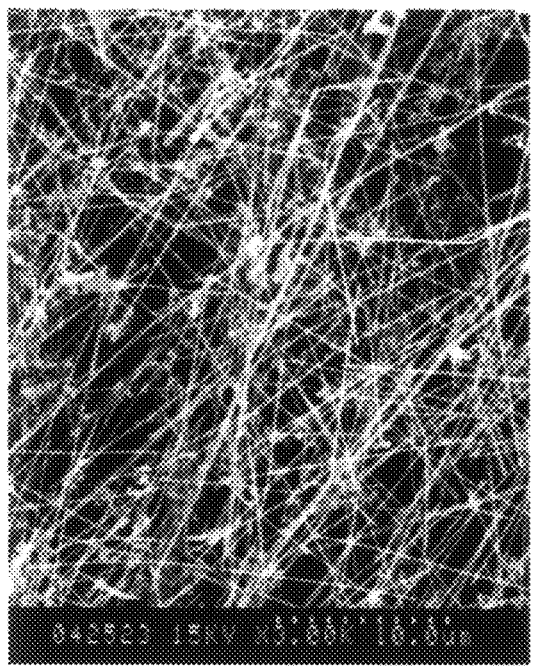
FIG. 1 is an image of indium nanowires according to Example 1 of the present invention, taken by a scanning electron microscope.

The present invention will be explained more concretely.

The present invention has been achieved by finding out, concerning indium which is relatively insusceptible to reduction, a fact that metal indium is brought into a wire shape having a higher ratio of averaged length to averaged thickness (aspect ratio), when the metal indium is obtained by subjecting subhalide (which means low-order halide) of indium to a disproportionation reaction in a nonaqueous solvent.

There will be explained a production method of an indium-based nanowire product, for obtaining the indium-based nanowire product.

Firstly, in the present invention, particles including subhalide (which means low-order halide) of indium as main components are disproportionation-reacted in a nonaqueous solvent, thereby obtaining nanowires including metal indium as main components.

The disproportionation reaction of indium subhalide is represented by the following [Formula 1].

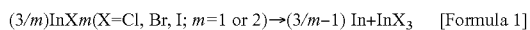

$$(3/m)\text{In}X_m(X=\text{Cl, Br, I; } m=1 \text{ or } 2) \rightarrow (3/m-1)\text{In} + \text{In}X_3 \quad \text{[Formula 1]}$$

Examples of subhalides preferably include subchloride (hypochlorite) in view of workability thereabout and handling ability of a reaction product thereof, and the value of m in the Formula 1 is preferably m=1 which results in an increased amount of indium to be reduced in the disproportionation reaction. Thus, the most preferable subhalide is indium monochloride (InCl).

Prior to the disproportionation reaction, it is desirable to subject subhalide particles to a pulverization treatment in a nonaqueous solvent, for example. This is because, without conducting the pulverization treatment, intermixture of coarse indium particles is likely to be caused, and simultaneously therewith, a percentage of nano-size indium wires in the obtained indium wires is highly possibly decreased. Further, the grinder to be used for the pulverization treatment is not particularly limited, and it is possible to adopt a commercially available grinder such as a paint shaker, beads mill, homogenizer, and the like. It is desirable that subhalide particles are preferably brought into fine particles having a particle diameter distribution between about 20 and 80 nm by virtue of the pulverization treatment.

The disproportionation reaction can be activated by adding water into an organic solvent containing indium subhalide fine particles therein. Further, it is possible to directly add water by exemplarily dropping water droplets, or to cause moisture in the atmospheric air to be absorbed from a surface of the solvent while stirring it in the atmospheric air to gradually cause the reaction.

Here, it is enough for the organic solvent to allow for obtainment of indium nanowires by a disproportionation reaction, in a manner to be appropriately selected from among the following, without necessarily limited thereto. Examples of the solvent include: alcohol-based solvents such as methanol (MA), ethanol (EA), 1-propanol (NPA), isopropanol (IPA), butanol, pentanol, benzyl alcohol, diacetone alcohol (DAA); ketone-based solvents such as acetone, methyl ethyl ketone (MEK), methyl propyl ketone, methyl isobutyl ketone (MIBK), cyclohexanone, isophorone; ester-based solvents such as ethyl acetate, butyl acetate, methyl lactate; glycol derivatives such as ethylene glycol monomethyl ether (MCS), ethylene glycol monoethyl ether (ECS), ethylene glycol isopropyl ether (IPC), ethylene glycol monobutyl ether (BCS), ethylene glycol monoethyl ether acetate, ethylene glycol monobutyl ether acetate, propylene glycol methyl ether (PGM), propylene glycol ethyl ether (PE), propylene glycol methyl ether acetate (PGM-AC), propylene glycol ethyl ether acetate (PE-AC), diethylene glycol monomethyl ether, diethylene glycol monoethyl ether, diethylene glycol monobutyl ether, diethylene glycol monomethyl ether acetate, diethylene glycol monoethyl ether acetate, diethylene glycol monobutyl ether acetate, diethylene glycol dimethyl ether, diethylene glycol diethyl ether, diethylene glycol dibutyl ether, dipropylene glycol monomethyl ether, dipropylene glycol monoethyl ether, and dipropylene glycol monobutyl ether; benzene derivatives such as toluene, xylene, mesitylene, dodecyl benzene; formamide (FA); N-methyl formamide; dimethyl formamide (DMF); dimethyl acetamide; dimethyl sulfoxide (DMSO); N-methyl-2-pyrrolidone (NMP); γ-butyrolactone; ethylene glycol; diethylene glycol; tetrahydrofuran (THF); and chloroform.

Note that it is possible to further add a polymer dispersant into the organic solvent, prior to achievement of the pulverization treatment and disproportionation reaction of particles including indium subhalide as main components in the nonaqueous solvent. Inclusion of the polymer dispersant may allow for excellent conduction of the pulverization treatment, and exhibit an action to promote growth of metal indium into nanowires upon disproportionation reaction. The kind and addition amount of the polymer dispersant may be appropriately selected exemplarily depending on the kind of the adopted nonaqueous solvent, and intended sizes (thicknesses, aspect ratios) of indium-based nanowires, and larger adding amounts of the polymer dispersant tend to result in smaller thicknesses of obtained indium-based nanowires.

Since indium-based nanowires produced in the organic solvent gradually sediment the nanowires are to be filtered and washed by alcohol or the like, or the nanowires are to be firstly washed by an operation to discard a supernatant after decantation and to again add alcohol or the like into the remaining organic solvent followed by filtering separation and by further drying, thereby allowing for obtainment of an indium-based nanowire product comprising indium-based nanowires. In case of the latter method, the solution (such as alcohol solution) containing indium-based nanowires before filtering separation, can be directly utilized for coating of indium-based nanowires.

Here, the indium-based nanowires are allowed to further contain one or more kinds of dopant metals of tin, zinc, zirconium, titanium, germanium, tungsten, and aluminum, in addition to metal indium. Exemplary methods therefor include one to exemplarily contain, into the indium subhalide fine particles, a compound (such as halide of a dopant metal) of one or more kinds of dopant metals of tin, zinc, zirconium, titanium, germanium, and aluminum, thereby introducing the dopant metal components into indium-based nanowires including metal indium as main components derived from the disproportionation reaction, upon formation of the nanowires. For example, in case of a disproportionation reaction of indium monochloride (InCl) fine particles containing tin dichloride ($SnCl_2$), tin is introduced into indium nanowires, as represented by [Formula 2]. However, this method allows for only extremely small amounts of zirconium, titanium, and aluminum to be introduced into indium nanowires, which dopant metal components each have an ionization tendency higher than that of indium. Further, since higher contents of dopant metals relative to metal indium will obstruct growth of indium nanowires into wire shapes, it is desirable in this method to adopt 0.02 mole or less of dopant metals relative to 1 mole of metal indium.

$$3InCl \rightarrow 2In + InCl_3,\ In + 3/2 SnCl_2 \rightarrow 3/2 Sn + InCl_3 \quad \text{[Formula 2]}$$

Furthermore, exemplary methods for containing dopant metals in metal indium include another to coat a dopant metal component onto obtained indium nanowires. For example, such a method is to mix a solution of dopant metal compounds into a solution containing dispersed indium nanowires, followed by addition of a reducing agent, thereby depositing the dopant metal components onto surfaces of the indium nanowires. According to this method, the indium nanowires are not affected in shapes and larger amounts of dopant metals can be contained relative to metal indium, and concretely, it is desirable to use 0.2 mole or less, and desirably 0.1 mole or less of dopant metals relative to 1 mole of metal indium. This is because, containment of dopant metals exceeding 0.2 mole deteriorates electroconductivity of an electroconductive oxide nanowire product comprising electroconductive oxide nanowires to be obtained from the indium-based nanowires.

Next, there will be explained a production method of oxide nanowire product comprising oxide nanowires including indium oxide as main components, by adopting the above obtained nanowire product comprising nanowires including metal indium as main components.

The production method of the present invention of an oxide nanowire product comprising oxide nanowires including indium oxide as main components is characterized in that the method comprises the step of:

subjecting, the indium-based nanowires including metal indium as main components obtained by the above method, to a heating oxidation treatment in an atmosphere containing oxygen and/or ozone, thereby obtaining oxide nanowires including indium oxide as main components.

The ambient including oxygen and/or ozone for the heat treatment is simply the atmospheric air. Although the heating condition is not particularly limited, it is desirable to achieve heating at 180 to 220° C. for 60 to 120 minutes and then at 350 to 600° C. for 60 to 120 minutes.

Although the obtained oxide nanowires including indium oxide as main components appear to be a light yellow powder by an observation of an external appearance, it can be easily confirmed that the nanowires have been brought into indium oxide nanowires by X-ray diffraction analysis. Further, it has been confirmed that the obtained oxide nanowires kept shapes of indium nanowires before oxidation as they were.

Moreover, the obtained oxide nanowires including indium oxide as main components can be brought into electroconductive oxide nanowires when the oxide nanowires are doped with one or more kinds of dopant metal components of tin, zinc, zirconium, titanium, germanium, tungsten, and aluminum, and the oxide nanowires can be brought into indium tin oxide (ITO) useful as a transparent electroconductive material when doped with tin, for example.

As a doping treatment of the dopant metal components, it is possible to exemplarily coat dopant metal and/or compound thereof onto surfaces of indium oxide nanowires, followed by heat treatment. The heat treatment can be conducted in the atmospheric air, at 350 to 600° C. for 60 to 120 minutes, for example. The heating atmosphere may be appropriately selected depending on components of the coating, and the heating is not necessarily required to be conducted in an atmosphere containing oxygen. This is because, in case that the coating component is hydroxide of dopant metal, for example, oxide of the dopant metal can be obtained by a thermal decomposition reaction by heating.

Apart from the method for obtaining the electroconductive oxide nanowire product from indium oxide nanowires, it is also possible in the present invention to obtain electroconductive oxide nanowires by subjecting the indium-based nanowires including dopant metals to a heating oxidation treatment in an atmosphere containing oxygen and/or ozone. The heating oxidation treatment can be conducted at 180 to 220° C. for 60 to 120 minutes and then at 350 to 600° C. for 60 to 120 minutes, similarly to the production of oxide nanowire product comprising oxide nanowires including indium oxide as main components. By this heating oxidation treatment, the dopant metals and indium are oxidized, and eventually these oxides dissolve into one another in a solid state, thereby allowing obtainment of electroconductive oxide nanowires including indium oxide as main components and containing oxides of the dopant metals.

It is desirable that the electroconductive oxide nanowire product obtained according to the present invention is previously and further enhanced in electroconductivity by subjecting the product to a reduction treatment (oxygen vacancy introduction treatment) configured to contact the product with hydrogen gas, alcohol gas, or the like at 250 to 400° C.

While there can be obtained the indium-based nanowire product comprising indium-based nanowires and the electroconductive oxide nanowire product comprising electroconductive oxide nanowires, having extremely large aspect ratios, according to the present invention as described above, it is desirable in each product that the ratio of averaged length to averaged thickness (aspect ratio) is 30 or more, preferably 50 or more, and more preferably 100 or more. Ratios less than 30 make it difficult to exhibit excellent functions expected for nanowires, and particularly, ratios of 10 or less result in rod-like fine particles like nanorods rather than nanowires and thus lead to considerable deterioration of functions.

The nanowires are to have an averaged thickness of 500 nm or less, preferably 200 nm or less. This is because, averaged thicknesses exceeding 500 nm make it difficult to exhibit excellent functions expected for nanowires. Further, the nanowires are to have an averaged length of 1000 µm or less, preferably 500 µm or less, and more preferably 200 µm or less. This is because, averaged lengths exceeding 1,000 µm lead to excessively large sizes of nanowires, and when the nanowires are used as electroconductive filler of various transparent electroconductive paints, there are caused such problems that: the nanowires are apt to sediment in paints to deteriorate dispersion stability, and filtration of paints is made more difficult, thereby bringing about difficulty in handling ability; and the nanowires are made non-uniform in coated films and thus film resistances and smoothness of film surfaces are deteriorated, thereby bringing about a problem of deteriorated film functions.

Here, it is desirable for the indium-based nanowires comprising metal indium to each have a single crystal structure. This is because, nanowires each made of single crystal are free of crystal grain boundaries, thereby enabling possession of functions superior to polycrystalline nanowires, inclusive of electric characteristics, strength, and the like. Further, the indium-based nanowire product and the electroconductive oxide nanowire product of the present invention are desirably to be obtained by the above-described production methods of indium-based nanowire product and electroconductive oxide nanowire product, thereby allowing for obtainment of the indium-based nanowire product and the electroconductive oxide nanowire product suitable for electroconductive fillers of various transparent electroconductive paints, and the like.

EXAMPLE

Although the present invention will be concretely described based on Examples, the present invention is not necessarily limited to the Examples.

Example 1

16 g of indium monochloride (InCl) powder sieved through 42 mesh (sieve opening: 355 µm) was mixed with 128 g of propylene glycol monomethyl ether acetate (PGMEA) and 0.4 g of a polymer dispersant (S36000 made by Avecia), followed by a pulverization treatment by a paint shaker adopting zirconia beads having diameters of 0.3 mm, thereby obtaining a dispersion of InCl fine particles having a particle diameter distribution between about 20 and 80 nm.

While 70 g of the dispersion of InCl fine particles was kept stirred, 70 g of ethanol was firstly added thereto, and 70 g of pure water was then gradually added to conduct a disproportionation reaction of the InCl fine particles, thereby obtaining a reacted solution containing indium nanowires (indium nanofibers). Since indium nanowires in the reacted solution gradually sedimented, there were repeatedly conducted operations to remove a supernatant after decantation, to add ethanol, and to stir the remaining solution, in a manner to progress removal of reaction products other than indium nanowires, thereby finally obtaining an indium-nanowire-containing ethanol solution comprising indium nanowires and ethanol.

The indium nanowires were filteredly separated from the indium-nanowire-containing ethanol solution, followed by drying, thereby obtaining an indium nanowire product according to Example 1.

The obtained indium nanowires were confirmed to comprise metal indium by a result of X-ray diffraction analysis. Further, from a result of observation by a scanning electron microscope (SEM), the indium nanowires had an averaged thickness of 150 nm (with distribution between 60 and 300 nm of thicknesses) and had lengths in a distribution between about 30 and 200 µm, thereby exhibiting ratios of averaged length to averaged thickness (aspect ratios) in a distribution between about 300 and 600.

It was also confirmed that the nanowires were each made of a single crystal, from a result of selected-area electron diffraction measurement.

Figure 2:
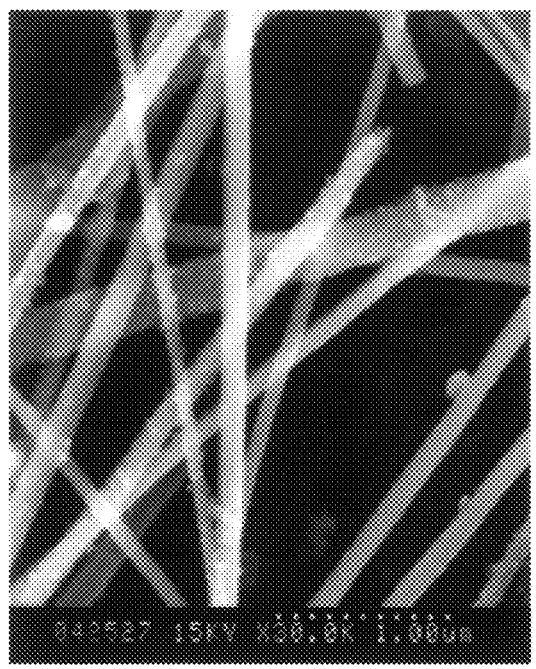
FIG. 2 is another image of indium nanowires according to Example 1 of the present invention, taken by a scanning electron microscope.
Figure 3:
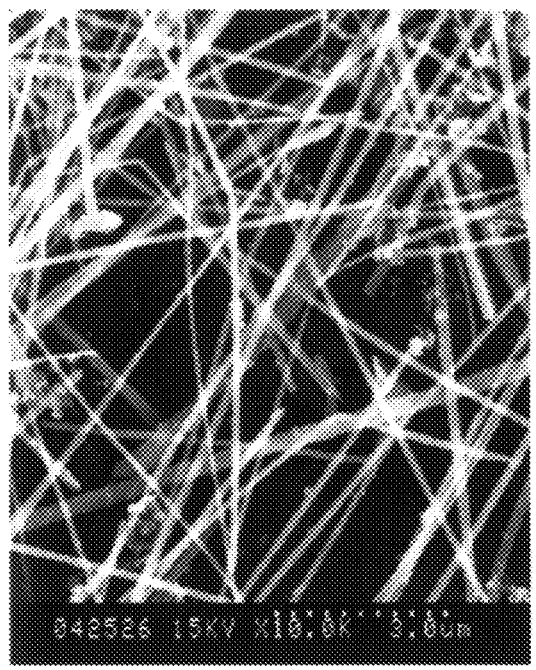
FIG. 3 is still another image of indium nanowires according to Example 1 of the present invention, taken by a scanning electron microscope.

FIG. 1 through FIG. 3 show SEM images of the indium nanowires, respectively. This enables to understand that the indium nanowires according to Examples have an averaged thickness of 150 nm, and extremely larger ratios of averaged length to averaged thickness (aspect ratios) between about 300 and 600.

Figure 4:
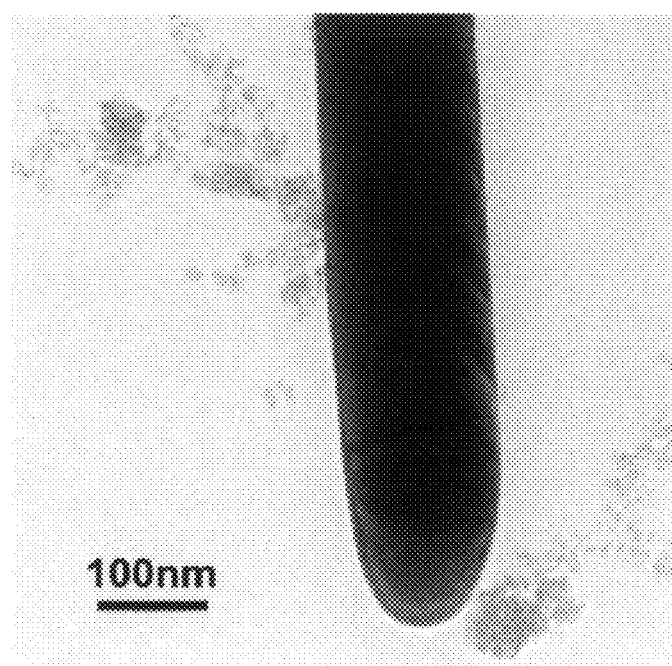
FIG. 4 is an image of a tip end of an indium nanowire according to Example 1 of the present invention, taken by a transmission electron microscope.
Figure 5:
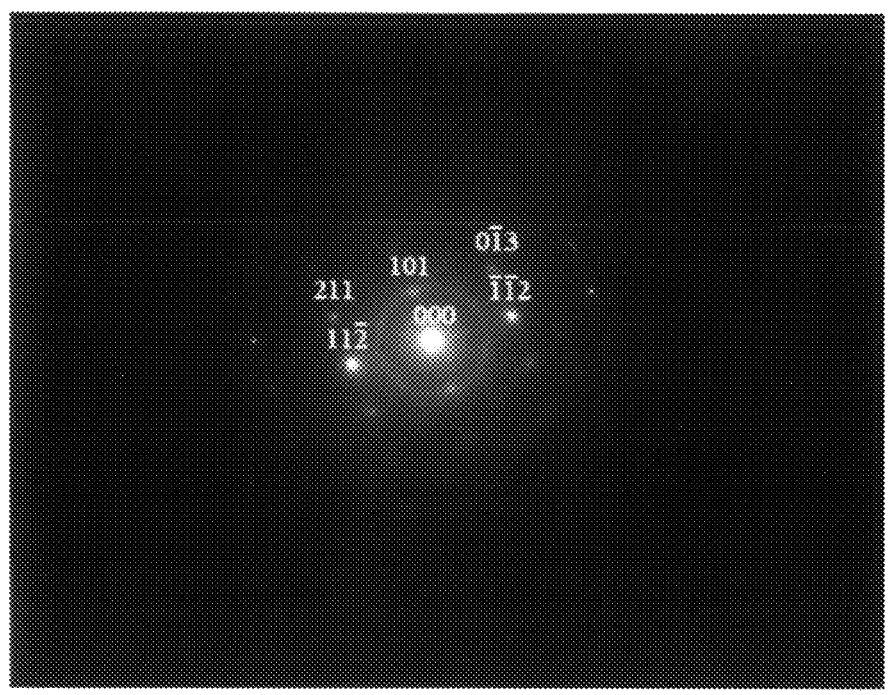
FIG. 5 is a selected-area electron diffraction pattern of an indium nanowire according to Example 1 of the present invention.

Further, FIG. 4 shows a transmission electron microscope (TEM) image of a tip end of an indium nanowire, and FIG. 5 shows a selected-area electron diffraction pattern near the tip end of the indium nanowire. The indium nanowire was confirmed to comprise a single crystal of metal indium, and to be formed by growing in a direction of crystal orientation [101].

Example 2

The indium nanowires obtained in Example 1 were subjected to a heat treatment (at 200° C. for 60 minutes, and then at 400° C. for 60 minutes) in the atmospheric air to cause oxidation of indium, thereby obtaining an indium oxide nanowire product comprising indium oxide nanowires according to Example 2.

Figure 6:
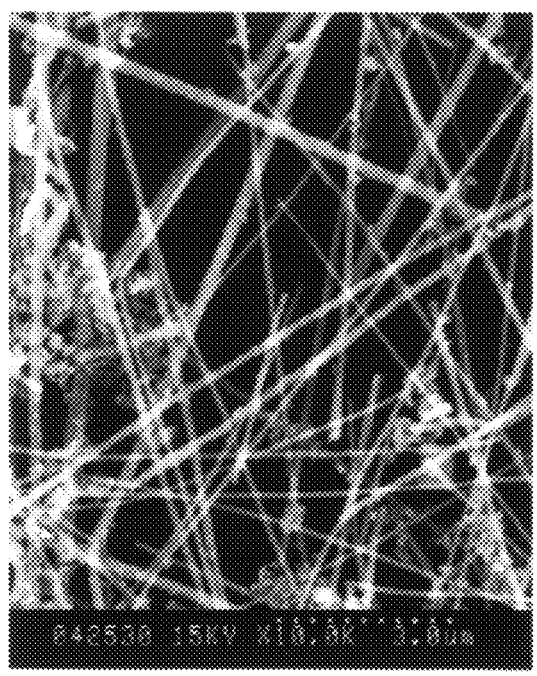
FIG. 6 is an image of indium oxide nanowires according to Example 2 of the present invention, taken by a scanning electron microscope.

The obtained indium oxide nanowires appeared to be a light yellow powder, and were confirmed to comprise indium oxide from a result of X-ray diffraction analysis. Further, it was confirmed that the nanowires kept shapes of indium nanowires before oxidation as they were, from a result of scanning electron microscope (SEM) observation (see FIG. 6).

Example 3

Added into the indium-nanowire-containing ethanol solution obtained in Example 1 was an aqueous solution of tin chloride ($SnCl_4 \cdot xH_2O$), followed by addition of an aqueous solution of sodium borohydride to cause a reduction reaction, to thereby conduct coating of tin onto surfaces of the indium nanowires. Thereafter and similarly to Example 1, there were repeatedly conducted operations to remove a supernatant after decantation, to add ethanol, and to stir the remaining solution, in a manner to progress removal of reaction products other than indium nanowires coated with tin, followed by filtering separation and drying, to obtain a tin-containing indium nanowire product comprising tin-containing indium nanowires according to Example 3.

The content of tin was 0.02 mole relative to 1 mole of metal indium. Further, it was confirmed that the tin-containing indium nanowires kept shapes of indium nanowires before tin coating as they were, from a result of scanning electron microscope (SEM) observation.

Example 4

The tin-containing indium nanowires obtained in Example 3 were subjected to a heat treatment (at 200° C. for 60 minutes, and then at 500° C. for 60 minutes) in the atmospheric air to cause oxidation of tin and indium and to progress solid-state dissolution of tin oxide in indium oxide, additionally followed by a reduction treatment (oxygen vacancy introduction treatment) at 300° C. by a methanol-containing nitrogen gas, thereby obtaining an electroconductive oxide nanowire product comprising electroconductive oxide nanowires constituted of indium tin oxide according to Example 4.

The obtained electroconductive oxide nanowires appeared to be a light blue powder, and were confirmed to comprise tin oxide dissolved in indium oxide in a solid state. Further, it was confirmed that the nanowires kept shapes of tin-containing indium nanowires before oxidation as they were, from a result of scanning electron microscope (SEM) observation.

The electroconductive oxide nanowire product had a resistance value of 0.1 Ω·cm in terms of volume resistivity (measured by 9.8M [mega] $Pa/cm^2 = 100$ $kgf/cm^2$).

Example 5

Added into a dispersion comprising pure water containing the indium oxide nanowires obtained in Example 2 dispersed therein, was an aqueous solution of tin chloride ($SnCl_4 \cdot xH_2O$), followed by addition of an aqueous ammonia solution into the dispersion while sufficiently stirring it to cause neutralization, to thereby conduct coating of tin hydroxide onto surfaces of the indium oxide nanowires. Thereafter and similarly to Example 1, there were repeatedly conducted operations to remove a supernatant after decantation, in a manner to progress removal of reaction products other than indium oxide nanowires coated with tin hydroxide, followed by filtering separation and drying. Next, the resultant nanowires were subjected to a heat treatment (at 500° C. for 120 minutes) in the atmospheric air to progress solid-state dissolution of tin oxide as coating component in indium oxide, additionally followed by a reduction treatment (oxygen vacancy introduction treatment) at 300° C. by a methanol-containing nitrogen gas, thereby obtaining an electroconductive oxide nanowire product comprising electroconductive oxide nanowires constituted of indium tin oxide.

The obtained electroconductive oxide nanowires appeared to be a light blue powder, and were confirmed to comprise tin oxide dissolved in indium oxide in a solid state. The content of tin was 0.02 mole relative to 1 mole of metal indium. Further, it was confirmed that the nanowires kept shapes of indium oxide nanowires before coating of tin hydroxide as they were, from a result of scanning electron microscope (SEM) observation. The electroconductive oxide nanowire product had a resistance value of 0.15 Ω·cm in terms of volume resistivity (measured by 9.8M [mega] $Pa/cm^2 = 100$ $kgf/cm^2$).

Figure 7:
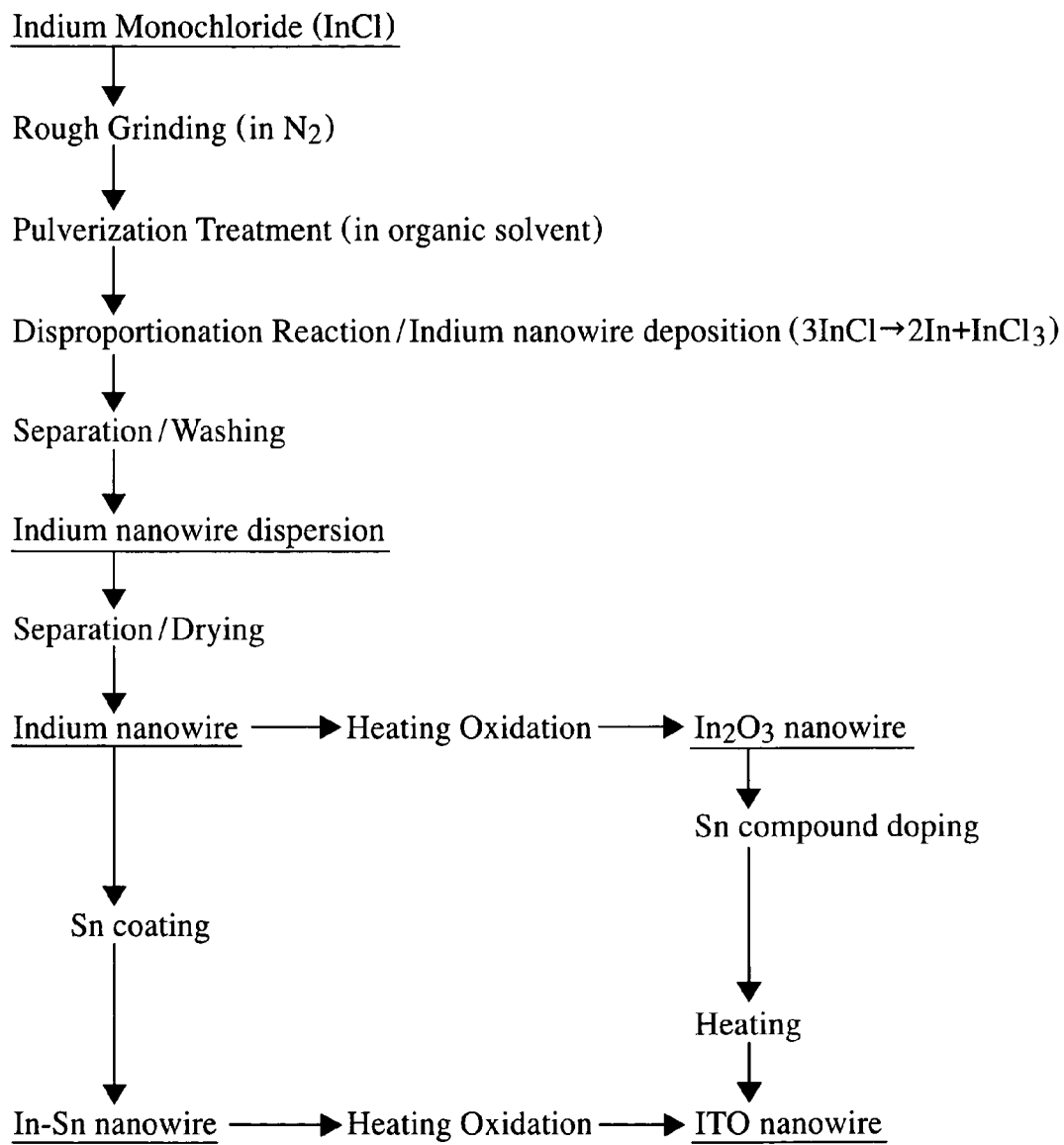
FIG. 7 is a schematic view of an exemplary production process of an indium-based nanowire product, an oxide nanowire product and an electroconductive oxide nanowire product according to the present invention.
Figure 8:
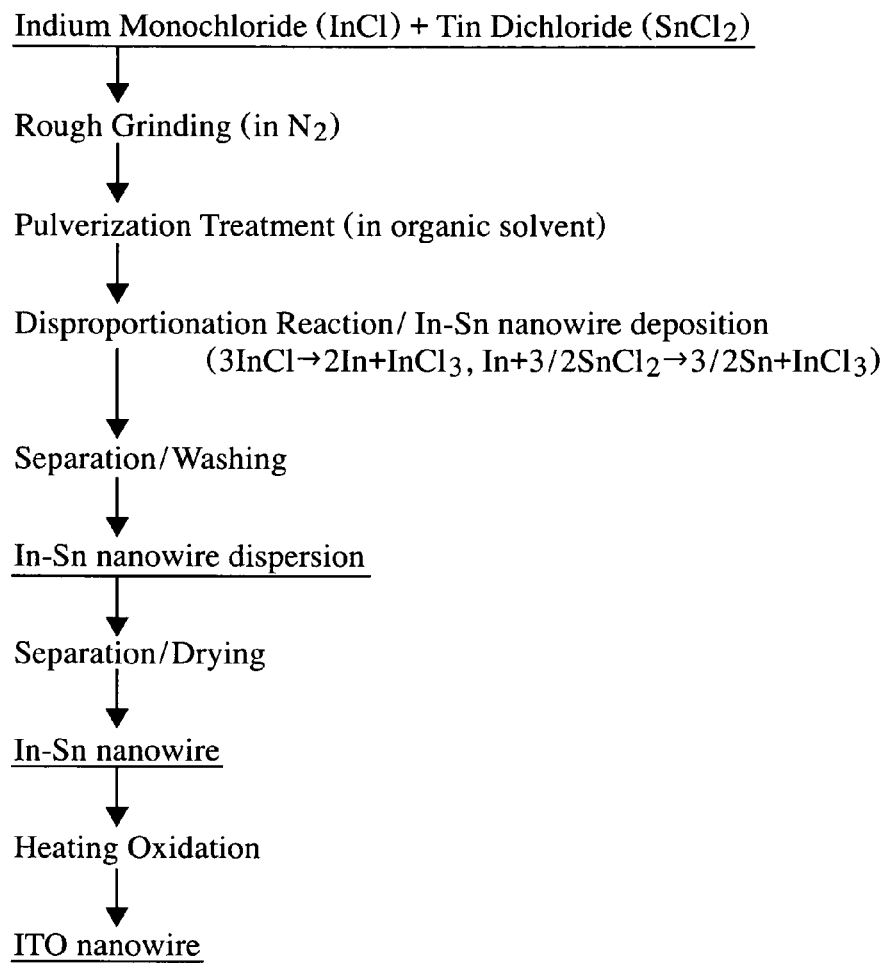
FIG. 8 is a schematic view of another exemplary production process of an indium-based nanowire product and an electroconductive oxide nanowire product according to the present invention.

Finally, FIG. 7 and FIG. 8 show schematic views of production processes of the indium-based nanowire product, oxide nanowire product and electroconductive oxide nanowire product according to the present invention.

INDUSTRIAL APPLICABILITY

The indium-based nanowire product comprising indium-based nanowires including metal indium as main components according to the present invention has a feature that the indium-based nanowires have an averaged thickness of 500 nm or less and have an extremely large ratio of averaged length to averaged thickness, and a particular feature that the nanowires comprising metal indium are each made of a single crystal, so that the indium-based nanowire product can be exemplarily utilized as electroconductive fillers of various transparent electroconductive films, and as nano-wirings. Further, the electroconductive oxide nanowire product, and particularly the ITO nanowire product obtained from the indium-based nanowire product or oxide nanowire product, are excellent in electroconductivity and thus industrially useful.

The invention claimed is:

1. A production method of an indium-based nanowire product comprising indium-based nanowires, wherein the method comprises the step of:
    disproportionation-reacting particles including indium subhalide as main components in a nonaqueous solvent, to obtain nanowires including metal indium as main components.

2. The production method of an indium-based nanowire product of claim 1, wherein the method further comprises the step of:
    subjecting the particles including indium subhalide as main components to a pulverization treatment, prior to the disproportionation reaction in the nonaqueous solvent.

3. The production method of an indium-based nanowire product of claim 1, wherein the subhalide is subchloride.

4. The production method of an indium-based nanowire product of claim 1, wherein the nonaqueous solvent contains a polymer dispersant therein.

5. The production method of an indium-based nanowire product of claim 1, wherein the particles including indium subhalide contain compounds of one or more kinds of dopant metals selected from the group consisting of tin, zinc, zirconium, titanium, germanium, tungsten, and aluminum, thereby obtaining nanowires including metal indium as main components and containing dopant metals.

6. A production method of an indium-based nanowire product, wherein the method further comprises the step of:
    coating one or more kinds of dopant metals selected from the group consisting if tin, zinc, zirconium, titanium, germanium, tungsten, and aluminum and/or compounds of the dopant metals onto the indium-based nanowires obtained by the method of claim 1.

7. A production method of an oxide nanowire product comprising oxide nanowires, wherein the method comprises the step of:
    subjecting the indium-based nanowires obtained by the method of claim 1 to a heating oxidation treatment in an atmosphere including oxygen and/or ozone, thereby obtaining oxide nanowires including indium oxide as main components.

8. A production method of an electroconductive oxide nanowire product comprising electroconductive oxide nanowires, wherein the method comprises the step of:
    subjecting the indium-based nanowires obtained by the method of claim 5, to a heating oxidation treatment in an atmosphere containing oxygen and/or ozone, thereby obtaining nanowires including indium oxide as main components and containing oxides of dopant metals.

9. A production method of an electroconductive oxide nanowire product comprising electroconductive oxide nanowires, wherein the method comprises the steps of:
    doping one or more kinds of dopant metals selected from the group consisting of tin, zinc, zirconium, titanium, germanium, tungsten, and aluminum and/or compounds of the dopant metals into the oxide nanowires obtained by the method of claim 7; and
    then subjecting the nanowires to a heat treatment, thereby obtaining nanowires including indium oxide and containing oxides of the dopant metals.

10. The production method of an electroconductive oxide nanowire product comprising electroconductive oxide nanowires of claim 8, wherein the electroconductive oxide nanowires include indium tin oxide as main components.

\* \* \* \* \*